US012627313B2

(12) United States Patent
 Huang

(10) Patent No.: US 12,627,313 B2
(45) Date of Patent: May 12, 2026

(54) SUCCESSIVE APPROXIMATION REGISTER ANALOG TO DIGITAL CONVERTER AND SIGNAL CONVERSION METHOD

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 212 days.

(21) Appl. No.: 18/536,314

(22) Filed: Dec. 12, 2023

(65) Prior Publication Data

US 2024/0204793 A1     Jun. 20, 2024

(30) Foreign Application Priority Data

Dec. 16, 2022     (TW) .................................. 111148471

(51) Int. Cl.
 *H03M 1/38*          (2006.01)
(52) U.S. Cl.
 CPC ..................................... *H03M 1/38* (2013.01)
(58) Field of Classification Search
 CPC ...... H03M 1/38; H03M 1/1245; H03M 1/403;
H03M 1/406
 USPC ................................ 341/155, 161, 144, 172
 See application file for complete search history.

(56) References Cited

U.S. PATENT DOCUMENTS 9,800,255 B2     10/2017  Huang
10,454,492 B1 *  10/2019  Shikata ................. H03M 1/466

10,804,919 B1 *  10/2020  Cranford ............. H03M 1/1061
11,271,577 B1     3/2022  Hu et al.
2018/0083647 A1 *  3/2018  Yoshioka .............. H03M 1/466
2019/0326919 A1    10/2019  Pernull et al.

OTHER PUBLICATIONS

OA letter of a counterpart TW application (appl. No. 111148471) mailed on Nov. 14, 2023. Summary of the TW OA letter: 1. Figure 1 is indefinite. 2. Claims 1, 3, 7-8, and 10 are alleged to be unpatentable over cited reference 1 (U.S. Appl. No. 11/271,577 B1) in view of cited reference 2 (US 2019/0326919 A1). 3. Claims 2, 4-6, and 9 are allowable. Correspondence bewteen claims of TW counterpart application and claims of US application: 1. Claims 1-5, 6-9, and 10 in TW counterpart application correspond to claims 1-5, 7-10, and 12 in US application, respectively.

* cited by examiner

*Primary Examiner* — Peguy Jean Pierre
(74) *Attorney, Agent, or Firm* — WPAT, PC

(57)          ABSTRACT

A successive approximation register analog to digital converter includes a capacitor array circuit, a quantizer circuit, a delay adjustment circuit, a control logic circuit, and a detector circuitry. The capacitor array circuit samples input signals to generate first signals and is sequentially switched according to a first digital code. The quantizer circuit quantizes the first signals according to a first control signal to generate second signals and receives the first control signal via a signal path. The delay adjustment circuit is coupled in parallel with the signal path and selectively adjusts a propagation delay of the first control signal. The control logic circuit generates the first digital code according to the second signals. The detector circuitry detects whether a quantization of the quantizer circuit is completed to generate the first control signal.

18 Claims, 6 Drawing Sheets

150

320

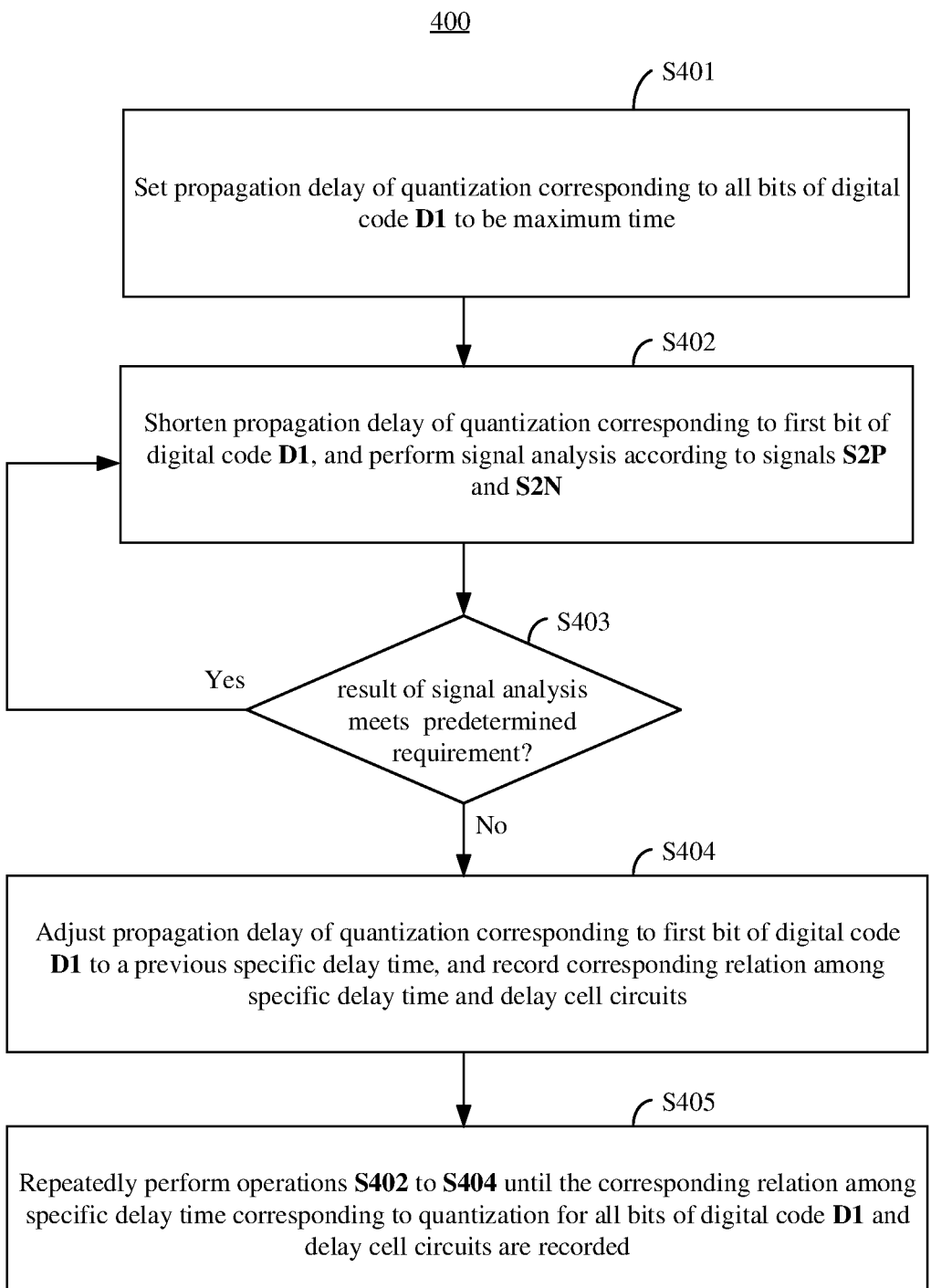

400

S401

Set propagation delay of quantization corresponding to all bits of digital code D1 to be maximum time

S402

Shorten propagation delay of quantization corresponding to first bit of digital code D1, and perform signal analysis according to signals S2P and S2N

S403 result of signal analysis meets predetermined requirement?

Yes

No

S404

Adjust propagation delay of quantization corresponding to first bit of digital code D1 to a previous specific delay time, and record corresponding relation among specific delay time and delay cell circuits

S405

Repeatedly perform operations S402 to S404 until the corresponding relation among specific delay time corresponding to quantization for all bits of digital code D1 and delay cell circuits are recorded

Fig. 4

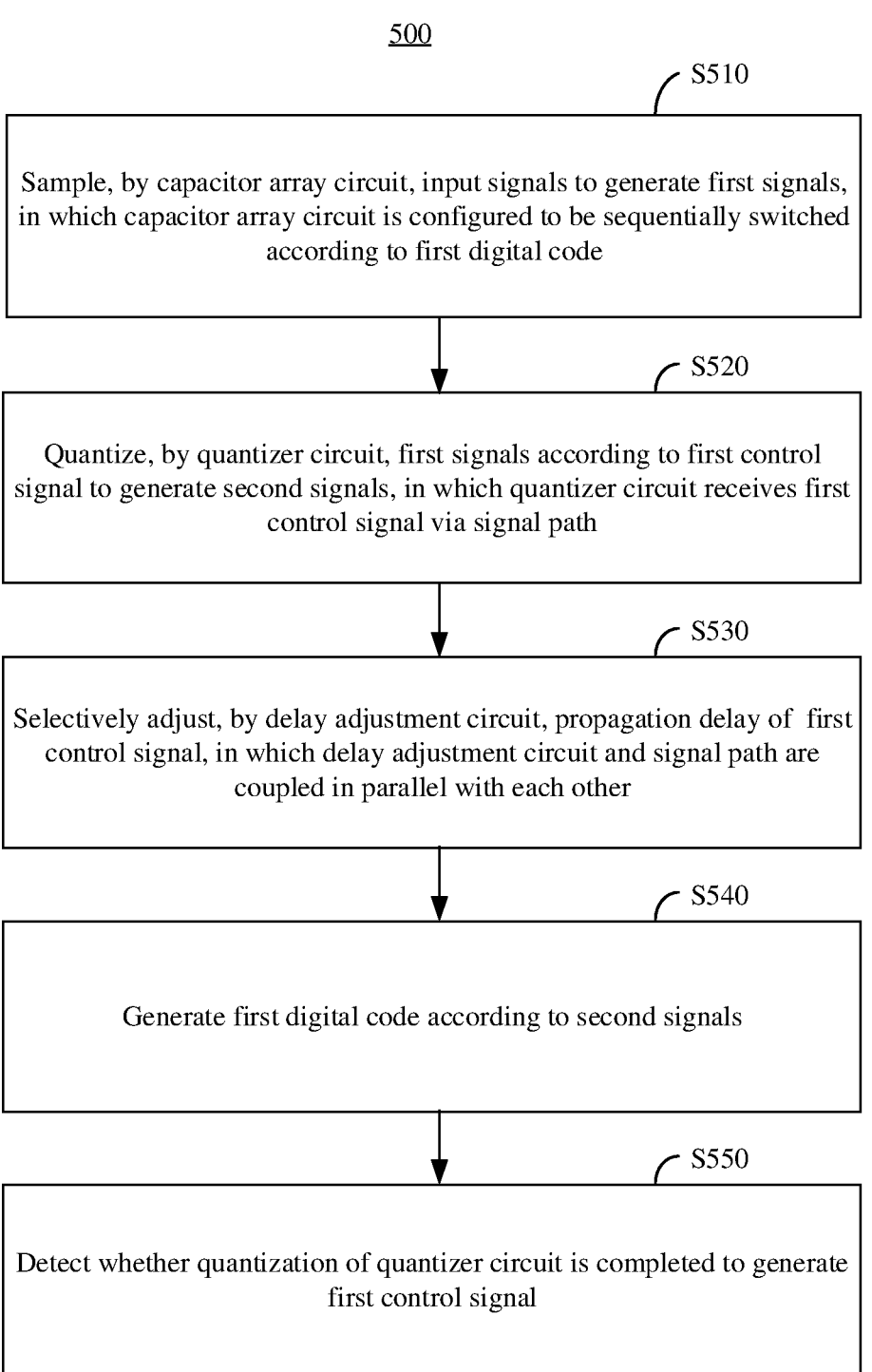

500

S510

Sample, by capacitor array circuit, input signals to generate first signals, in which capacitor array circuit is configured to be sequentially switched according to first digital code

S520

Quantize, by quantizer circuit, first signals according to first control signal to generate second signals, in which quantizer circuit receives first control signal via signal path

S530

Selectively adjust, by delay adjustment circuit, propagation delay of first control signal, in which delay adjustment circuit and signal path are coupled in parallel with each other

S540

Generate first digital code according to second signals

S550

Detect whether quantization of quantizer circuit is completed to generate first control signal

Fig. 5

SUCCESSIVE APPROXIMATION REGISTER ANALOG TO DIGITAL CONVERTER AND SIGNAL CONVERSION METHOD

BACKGROUND OF THE INVENTION

1. Field of the Invention

The present disclosure relates to a successive approximation register analog to digital converter, especially to a successive approximation register analog to digital converter with a delay adjustment mechanism and a signal conversion method thereof.

2. Description of Related Art

In an analog-to-digital converter that employs capacitor array circuit(s) for signal conversion, the analog-to-digital converter usually performs a quantization in a fixed period, and the capacitor array circuit usually takes some time to be stabilized during the switching process. However, due to practical non-ideal factors, the stabilization time required for each capacitor in the capacitor array circuit after switching may be different, such that not all capacitors can be completely stable in the same fixed time. Thus, if the analog to digital converter starts the next quantization while the capacitor array circuit is not fully stabilized, the digital signal generated by the analog to digital converter will be different from the digital signal that is generated after the capacitor array circuit is fully stabilized, resulting in reduced output resolution.

SUMMARY OF THE INVENTION

In some aspects, an object of the present disclosure is to, but not limited to, provide a successive approximation register analog to digital converter with a delay adjustment mechanism and a signal conversion method thereof, in order to make an improvement to the prior art.

In some aspects, a successive approximation register analog to digital converter includes a capacitor array circuit, a quantizer circuit, a delay adjustment circuit, a control logic circuit, and a detector circuitry. The capacitor array circuit is configured to sample a plurality of input signals to generate a plurality of first signals, in which the capacitor array circuit is sequentially switched according to a first digital code. The quantizer circuit is configured to quantize the plurality of first signals according to a first control signal to generate a plurality of second signals, in which the quantizer circuit receives the first control signal via a signal path. The delay adjustment circuit is coupled in parallel with the signal path and is configured to selectively adjust a propagation delay of the first control signal. The control logic circuit is configured to generate the first digital code according to the plurality of second signals. The detector circuitry is configured to detect whether a quantization of the quantizer circuit is completed to generate the first control signal.

In some aspects, a signal conversion method includes the following operations: sampling, by a capacitor array circuit, a plurality of input signals to generate a plurality of first signals, wherein the capacitor array circuit is sequentially switched according to a first digital code; quantizing, by a quantizer circuit, the plurality of first signals according to a first control signal to generate a plurality of second signals, wherein the quantizer circuit receives the first control signal via a signal path; selectively adjusting, by a delay adjustment circuit, a propagation delay of the first control signal, in which the delay adjustment circuit and the signal path are coupled in parallel with each other; generating the first digital code according to the plurality of second signals; and detecting whether a quantization of the quantizer circuit is completed to generate the first control signal.

These and other objectives of the present disclosure will no doubt become obvious to those of ordinary skill in the art after reading the following detailed description of the preferred embodiments that are illustrated in the various figures and drawings.

BRIEF DESCRIPTION OF THE DRAWINGS

FIG. 4 illustrates a flow chart of operations performed by the delay control circuit in FIG. 1 according to some embodiments of the present disclosure.

FIG. 5 illustrates a flow chart of a signal conversion method according to some embodiments of the present disclosure.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system implemented with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, similar/identical elements in various figures are designated with the same reference number.

Figure 1:
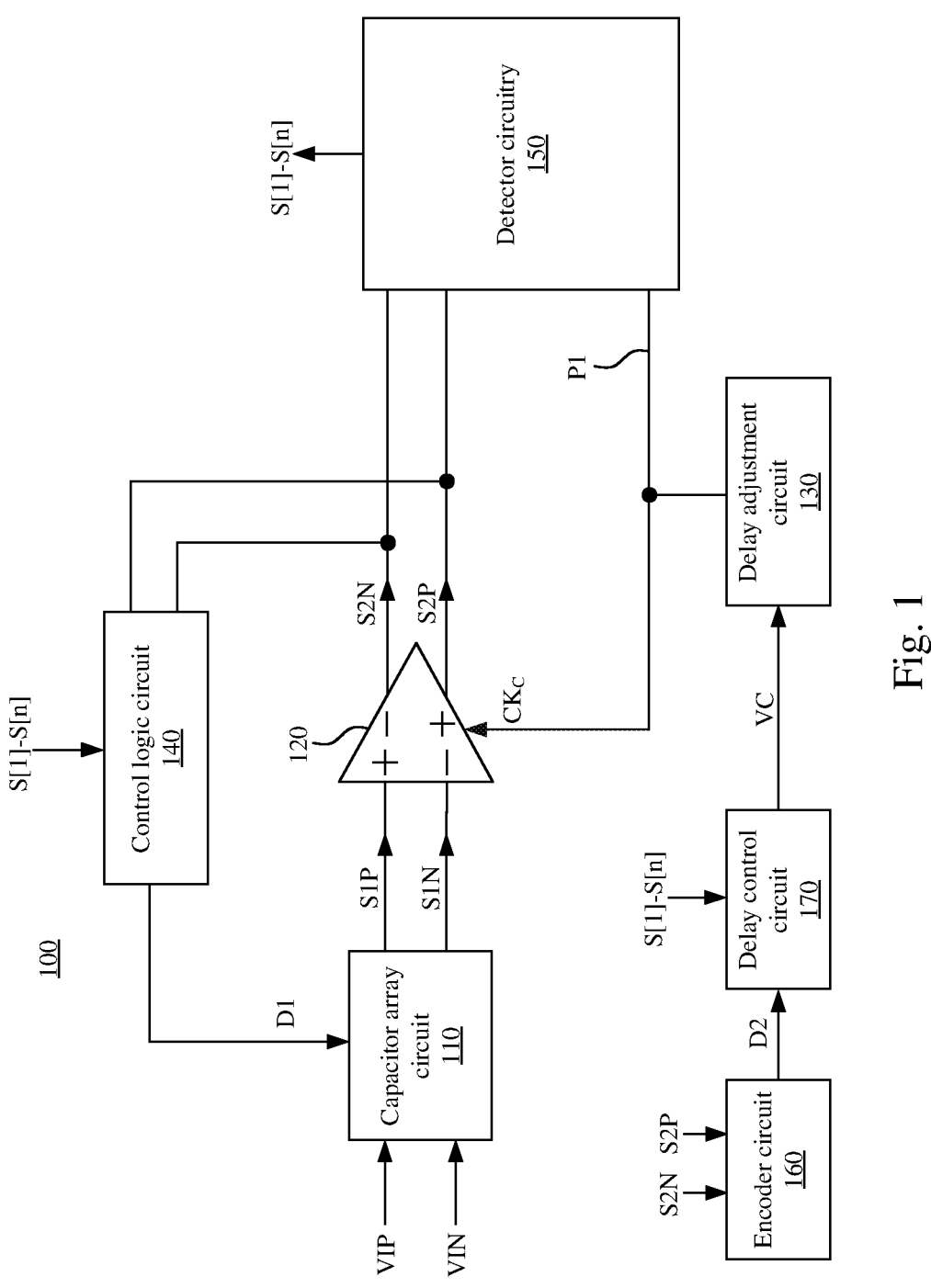
FIG. 1 illustrates a schematic diagram of a successive approximation register analog-to-digital converter according to some embodiments of the present disclosure.

FIG. 1 illustrates a schematic diagram of a successive approximation register (SAR) analog to digital converter (ADC) 100 according to some embodiments of the present disclosure. In some embodiments, the SAR ADC 100 includes a propagation delay adjustment mechanism that is configured to adjust the start time of the quantization.

The SAR ADC 100 includes a capacitor array circuit 110, a quantizer circuit 120, a delay adjustment circuit 130, a control logic circuit 140, a detector circuitry 150, an encoder circuit 160, and a delay control circuit 170. The capacitor array circuit 110 is configured to sample input signals VIP and VIN to generate signals S1P and S1N and is configured to be sequentially switched according to a digital code D1. In some embodiments, the capacitor array circuit 110 may include capacitors corresponding to different weights and switches. These switches are respectively coupled to at least a portion of the capacitors, in order to selectively transmit a corresponding reference voltage to a corresponding capacitor according to bits of the digital code D1. As a result, the signals S1P and S1N are sequentially updated, and thus signals S2P and S2N are sequentially updated, in order to generate the bits of the digital code D1. In some embodiments, the arrangement of the capacitors and switches in the capacitor array circuit 110 may be similar to that of a capacitive digital-to-analog converter, and thus further details will not be given here.

The quantizer circuit 120 quantizes the signals S1P and S1N according to a control signal $CK_C$ to generate the signals S2P and S2N. In some embodiments, the quantizer circuit 120 may be a differential comparator circuit, which may reset the signals S2P and S2N according to the control signal $CK_C$ or quantize the signals S1P and S1N (i.e., the aforementioned quantization) according to the control signal $CK_C$. For example, when the control signal $CK_C$ has a first level (which may be, as an example but not limited to, a low level), the quantizer circuit 120 resets the signals S2P and S2N. Under this condition, the signals S2P and S2N are all reset to a predetermined level. On the other hand, when the control signal $CK_C$ has a second level (which may be, as an example but not limited to, a high level), the quantizer circuit 120 starts performing the quantization, in order to compare the signals S1P and S1N and generate the signals S2P and S2N. Under this condition, the level of the signal S2P will be different from that of the signal S2N. For example, if the signal S1P is higher than the signal S1N, the signal S2P has a high level while signal S2N has a low level. If the signal S1P is lower than the signal S1N, the signal S2P has the low level while the signal S2N has the high level.

The quantizer circuit 120 receives the control signal $CK_C$ from the detector circuitry 150 via a signal path P1. The delay adjustment circuit 130 is coupled in parallel with the signal path P1 and is configured to adjust a propagation delay of the control signal $CK_C$. In some embodiments, the delay adjustment circuit 130 further adjusts the propagation delay according to a control signal VC. The configuration and operation of the delay adjustment circuit 130 will be given with reference to FIGS. 2A, 2B, and 2C.

The control logic circuit 140 is configured to generate the digital code D1 according to the signals S2P and S2N. In some embodiments, the control logic circuit 140 performs the SAR algorithm according to the signals S2P and S2N to sequentially generate the bits (not shown) of the digital code D1. After one bit of the digital code D1 is generated, the capacitor array circuit 110 is switched to adjust the reference voltage received by at least one capacitor in the capacitor array circuit 110, in order to update the signals S1P and S1N accordingly. In this manner, the quantizer circuit 120 generates new signals S2P and S2N according to the updated signals S1P and S1N, such that the control logic circuit 140 generates a subsequent bit of the digital code D1. With this analogy, the control logic circuit 140 is able to generate all bits of the digital code D1. In other words, a single quantization performed by the quantizer circuit 120 corresponds to one bit of the digital code D1 and is able to switch at least one switch in the capacitor array circuit 110. In some embodiments, the control logic circuit 140 is implemented with one or more digital circuits capable of performing the aforementioned algorithm. The detector circuitry 150 is configured to detect whether the quantization of the quantizer circuit 120 is completed, in order to generate the control signal $CK_C$. In some embodiments, the detector circuitry 150 performs a counting operation according to the signals S2P and S2N to sequentially generate bits S[1]-S[n], and generates the control signal $CK_C$ according to a last bit of the bits S[1]-S[n]. In some embodiments, the value of n may be a positive integer greater than or equal to 1, and is the same as the number of bits of the digital code D1. The configuration and operations of the detector circuitry 150 will be given with reference to FIGS. 3A and 3B.

The delay control circuit 170 is configured to generate a control signal VC according to the signals S2P and S2N and the bits S[1]-S[n]. In some embodiments, the delay control circuit 170 may determine which bit of the digital code D1 is being generated by the quantizer circuit 120 according to the bits S[1]-S[n], and analyze a specific digital code generated based on the signals S2P and S2N to generate a corresponding control signal VC. Similarly, in some embodiments, the control logic circuit 140 may also receive the bits S[1]-S[n] and determine which bit of the digital code D1 is being generated by the quantizer circuit 120, in order to generate the corresponding bit of the digital code D1 accordingly. In some embodiments, the specific digital code may be the digital code D1. In some embodiments, the specific digital code may be a digital code D2 generated by the encoder circuit 160. The encoder circuit 160 encodes and/or corrects the signals S2P and S2N to generate the digital code D2. The delay control circuit 170 may generate the control signal VC according to pre-simulated or measured result(s) and the specific digital code. In some embodiments, the delay control circuit 170 may be implemented with a microcontroller circuit or a digital circuit that executes a specific state machine. Operations of the delay control circuit 170 will be described later with reference to FIG. 4.

As mentioned above, during the signal conversion process, the capacitors in the capacitor array circuit 110 may update the signals S1P and S1N according to the digital code D1 to gradually generate all bits of the digital code. In practical applications, charges stored in the capacitor array circuit need some time to be redistributed after the capacitors are switched. In some related approaches, the quantizer circuit performs quantization within a fixed period during the aforementioned conversion process to generate the corresponding bit in the digital code. However, due to impacts from practical process variations, voltage variations, temperature variations, and/or the like, charges in the capacitor array circuit may be unable to be redistributed and stabilized within a certain time period, which results in the generation of inaccurate signals S1P, S1N, S2P, and S2N.

Compared with the aforementioned approaches, in the above embodiments of the present disclosure, with the arrangements of the delay adjustment circuit 130 and the detector circuitry 150, the control signal $CK_C$ transmitted to the quantizer circuit 120 may be adjusted to control the timing of the quantizer circuit 120 to start quantization. As a result, it is able to ensure that the capacitors in the capacitor array circuit 110 have sufficient stabilization time, in order to avoid errors caused by unstable charge redistribution. Furthermore, as the delay adjustment circuit 130 and the signal path P1 are coupled in parallel with each other rather than coupled in series, the delay adjustment circuit 130 does not introduce a fixed delay to the signal path P1. As a result, it is able to avoid slowing down the operating speed of the SAR ADC 100.

Figure 2A:
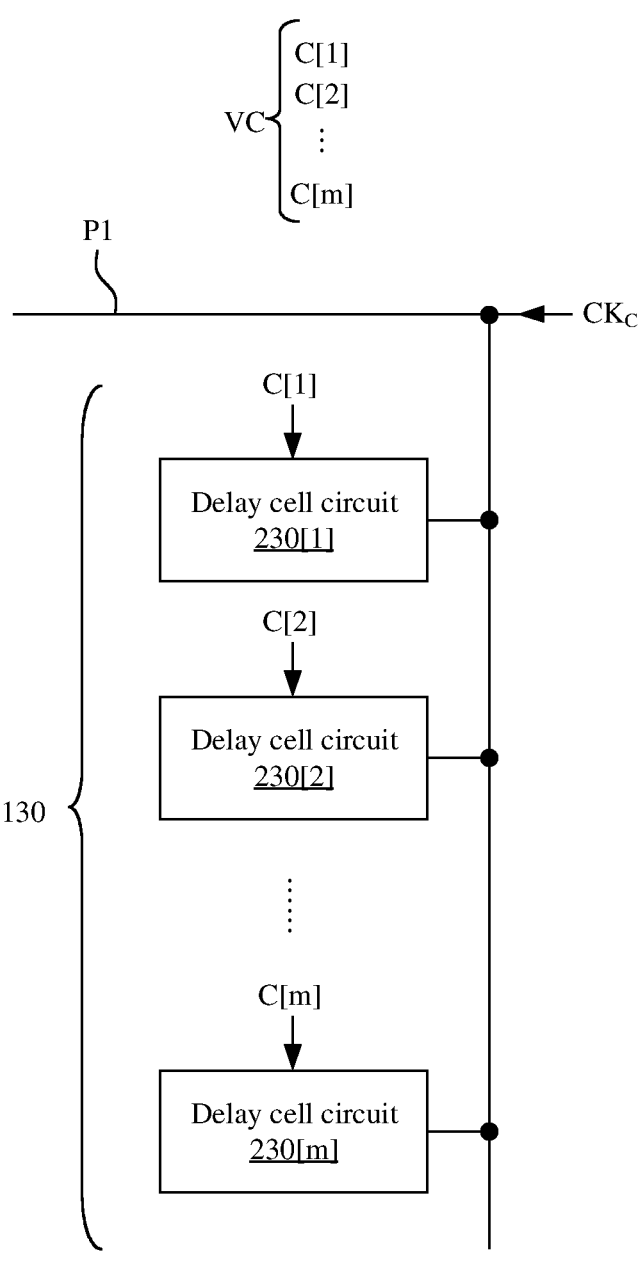
FIG. 2A illustrates a schematic diagram of the delay adjustment circuit in FIG. 1 according to some embodiments of the present disclosure.

FIG. 2A illustrates a schematic diagram of the delay adjustment circuit 130 in FIG. 1 according to some embodiments of the present disclosure. The delay adjustment circuit 130 includes delay cell circuits 230[1]-230[m], in which the value of m can be an integer greater than or equal to 1. The delay cell circuits 230[1]-230[m] are coupled in parallel with the signal path P1 in FIG. 1 and selectively adjust the capacitance value of the signal path P1 according to bits C[1]-C[m] of the control signal VC. If the capacitance value increases, the propagation delay introduced to the control signal $CK_C$ by the signal path P1 also increases, which results in a delay of the time the quantizer circuit 120 receives the control signal $CK_C$. In other words, by selectively turning on the delay cell circuits 230[1]-230[m], the propagation delay of the control signal $CK_C$ can be set, in order to adjust the start time of the next quantization of the quantizer circuit 120.

In some embodiments, each of the delay cell circuits 230[1]-230[m] may have the same circuit configuration (i.e., providing an identical capacitance value). Consequently, when a higher number of the delay cell circuits 230[1]-230[m] are turned on, the capacitance value of the signal path P1 increases. Alternatively, in other embodiments, each of the delay cell circuits 230[1]-230[m] may have different circuit configurations, for example, having different transistor sizes to provide different capacitance values. Therefore, by turning on one or more of the delay cell circuits 230[1]-230[m], the capacitance value of the signal path P1 can be adjusted. In some embodiments, each of the delay cell circuits 230[1]-230[m] may be implemented with the circuit shown in FIG. 2B, the circuit shown in FIG. 2C, and/or a combination thereof.

Figure 2B:
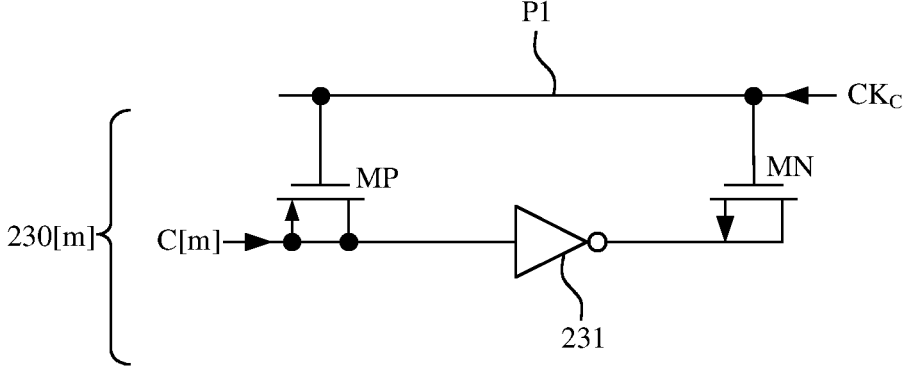
FIG. 2B illustrates a schematic diagram of the delay cell circuit in FIG. 2A according to some embodiments of the present disclosure.

FIG. 2B illustrates a schematic diagram of the delay cell circuit 230[m] in FIG. 2A according to some embodiments of the present disclosure. In this example, the delay cell circuit 230[m] includes a transistor MP, an inverter circuit 231, and a transistor MN. The conductivity type of transistor MP is opposite to that of transistor MN. For example, the transistor MP is a P-type transistor, and the transistor MN is an N-type transistor. A first terminal of the transistor MP (e.g., source) receives a corresponding bit of the control signal VC (e.g., the bit C[m]), a second terminal of the transistor MP (e.g., drain) is coupled to a first terminal of the transistor MP, and a control terminal of the transistor MP (e.g., gate) is coupled to the signal path P1. An input terminal of the inverter circuit 231 is coupled to the second terminal of transistor MP. A first terminal of the transistor MN (e.g., source) is coupled to an output terminal of the inverter circuit 231. A second terminal of the transistor MN (e.g., drain) is coupled to the first terminal of transistor MN, and a control terminal (e.g., gate) of the transistor MN is coupled to the signal path P1. The transistors MP and MN may operate as voltage-controlled capacitors. For example, when the bit C[m] has a logic value of 1, the output of the inverter circuit 231 has a logic value of 0. Under this condition, the transistors MP and MN may be turned on to operate as capacitors to provide a corresponding capacitance value to the signal path P1. Alternatively, when the bit C[m] has the logic value of 0, the output of the inverter circuit 231 has the logic value of 1. Under this condition, the transistors MP and MN may be turned off and not provide the corresponding capacitance value.

Figure 2C:
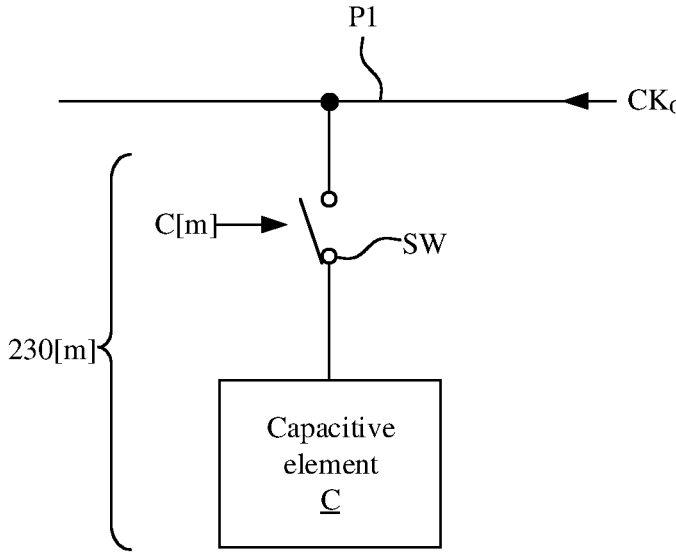
FIG. 2C illustrates a schematic diagram of the delay cell circuit in FIG. 2A according to some embodiments of the present disclosure.

FIG. 2C illustrates a schematic diagram of the delay cell circuit 230 [m] in FIG. 2A according to some embodiments of the present disclosure. In this instance, the delay cell circuit 230[m] includes a switch SW and a capacitive element C. A first terminal of the switch SW is coupled to the signal path P1, a second terminal of the switch SW is coupled to the capacitive element C, and a control terminal of the switch SW receives the corresponding bit (e.g., bit C[m]) of the control signal VC. The switch SW may be selectively turned on according to the bit C[m] to couple the capacitive element C to the signal path P1, thereby adjusting the capacitance value of the signal path P1. For example, when the bit C[m] has the logic value of 1, the switch SW may be turned on to increase the capacitance value of signal path P1. Alternatively, when the bit C[m] has the logic value of 0, the switch SW may be turned off, and the capacitance value of the signal path P1 remains unchanged.

In some embodiments, the capacitive element C may be implemented with, but not limited to, transistor(s). For example, if the capacitive element C is implemented with a P-type transistor, the source and drain of this P-type transistor may receive a high voltage (e.g., the supply voltage in the system), and the gate of this P-type transistor may be coupled to the second terminal of the switch SW. Alternatively, if the capacitive element C is implemented with an N-type transistor, the source and drain of this N-type transistor may receive a low voltage (e.g., the ground voltage in the system), and the gate of this N-type transistor may be coupled to the second terminal of the switch SW. The above configurations of the capacitive element C are provided for illustrative purposes, and the present disclosure is not limited thereto.

Figure 3A:
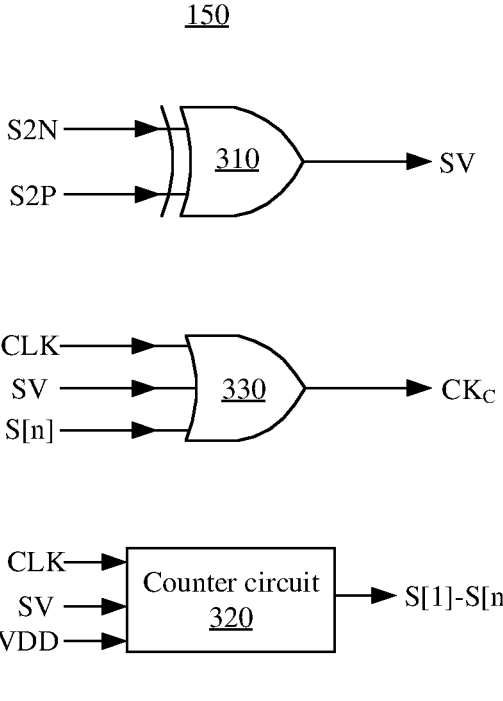
FIG. 3A illustrates a schematic diagram of the detector circuitry in FIG. 1 according to some embodiments of the present disclosure.

FIG. 3A illustrates a schematic diagram of the detector circuitry 150 in FIG. 1 according to some embodiments of the present disclosure. The detector circuitry 150 includes a logic gate circuit 310, a counter circuit 320, and a logic gate circuit 330. The logic gate circuit 310 is configured to generate a valid signal SV according to the signals S2P and S2N. The logic gate circuit 310 may be configured to determine whether the quantization of the signals S2P and S2N is completed. As mentioned above, before the quantization is performed, the signals S2P and S2N are reset to a predetermined level. Once quantization is completed, one of the signals S2P and S2N will have a high level, while the other of the signals S2P and S2N will have a low level. Consequently, the logic gate circuit 310 may determine whether the quantization of the quantizer circuit 120 is completed according to the levels of the signals S2P and S2N. In some embodiments, the logic gate circuit 310 may be implemented with an exclusive OR (XOR) gate circuit. In different embodiments, the logic gate circuit 310 may be implemented with other types of logic gates. For example, the logic gate circuit 310 may be a NAND gate circuit as well.

The counter circuit 320 is configured to sequentially output the voltage VDD to be the bits S[1]-S[n] according to a clock signal CLK and the valid signal SV. As mentioned above, one quantization of the quantizer circuit 120 corresponds to one bit of the digital code D1. By utilizing the counter circuit 320, it may determine which bit of the digital code D1 is currently being quantized by the quantizer circuit 120. For example, when the logic gate circuit 310 detects the signals S2P and S2N (generated from the first quantization of the quantizer circuit 120) and determines that the quantization is completed, the valid signal SV will have a logic value of 1. In response to this valid signal SV, the counter circuit 320 may output the voltage VDD to be the bit S[1] (which has a logic value of 1) to indicate that the current quantization corresponds to the first bit of the digital code D1. Similarly, it can be understood that bit S[n] indicates the current quantization corresponds to the nth bit of the digital code D1.

The logic gate circuit 330 is configured to generate the control signal $CK_C$ according to the clock signal CLK, the valid signal SV, and a last bit S[n] in the bits S[1]-S[n]. As mentioned above, the control signal $CK_C$ may be configured to control the quantizer circuit 120 to reset the signals S2P and S2N or to perform the quantization. In some embodiments, the clock signal CLK may be configured to set a fixed conversion period and reset period. In some embodiments, when one of the bit S[n], the clock signal CLK, or the valid signal SV has a high level corresponding to the logic value of 1, the control signal $CK_C$ has a reset level to control the quantizer circuit 120 to reset the signals S2P and S2N. Under this condition, the logic gate circuit 330 may be, but not limited to, an OR gate circuit. In other words, when the valid signal SV is switched to have the logic value of 1, it indicates that the current quantization has been completed. Under this condition, the logic gate circuit 330 may output the control signal $CK_C$ having the high level to bring forward the reset period of the quantizer circuit 120. When the bit S[n] is switched to the logic value of 1, it indicates that all bits of the digital code D1 have been generated. Under this condition, the logic gate circuit 330 may output the control signal $CK_C$ having the high level to allow the quantizer circuit 120 to reset in advance and prepare for the next signal conversion.

Figure 3B:
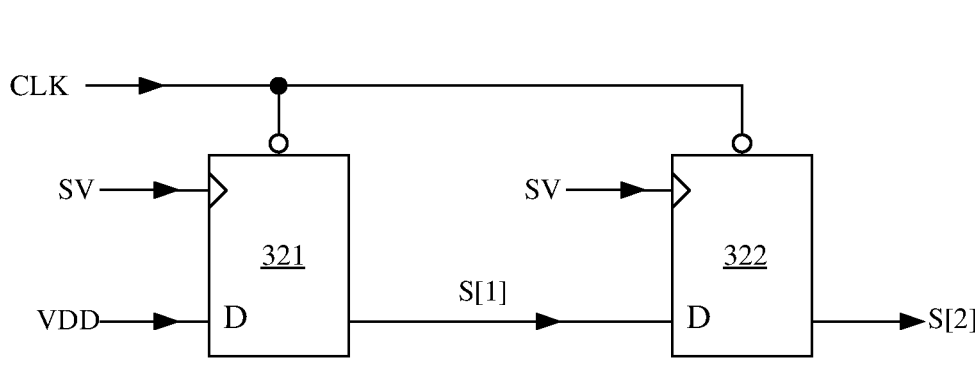
FIG. 3B illustrates a schematic diagram of the counter circuit in FIG. 3A according to some embodiments of the present disclosure.

FIG. 3B illustrates a schematic diagram of the counter circuit 320 in FIG. 3A according to some embodiments of the present disclosure. In this example, it is assumed that the aforementioned value of n is 2, but the present disclosure is not limited thereto. In different embodiments, according to the different number of bits of the digital code D1 and the different number of capacitors (and/or switches) in the capacitor array circuit 110, the number of flip-flop circuits employed in the counter circuit 320 may be adjusted accordingly.

The counter circuit 320 includes flip-flop circuits 321 and 322. The flip-flop circuits 321 and 322 are coupled in series to form a counter. These flip-flop circuits 321 and 322 may be reset according to the clock signal CLK and sequentially output the voltage VDD to be the bits S[1] and S[2] according to the valid signal SV. For example, each of the flip-flop circuits 321 and 322 may be a D-type flip-flop with an inverting input terminal, in which the inverting input terminal receives the clock signal CLK to determine whether to reset the flip-flop circuits 321 and 322. When the clock signal CLK has a high level, the flip-flop circuits 321 and 322 reset the bits S[1] and S[2] to be the logic values of 0. When the clock signal CLK has a low level, the flip-flop circuits 321 and 322 may sequentially output the voltage VDD to be the bits S[1] and S[2] according to the valid signal SV. For example, when the clock signal CLK has the low level and the valid signal SV has a logic value of 1 for the first time, the flip-flop circuit 321 may output the voltage VDD to be the bit S[1] (which has the logic value of 1). Then, when the clock signal CLK has the logic low level again and the valid signal SV has the logic value of 1 for the second time, the flip-flop circuit 322 may output the bit S[1] to be the bit S[2] (which has the logic value of 1).

FIG. 4 illustrates a flow chart of operations performed by the delay control circuit 170 in FIG. 1 according to some embodiments of the present disclosure. In operation S401, the propagation delay of the quantization corresponding to all bits of the digital code D1 is set to be a maximum time. For example, all bits C[1]-C[m] in the control signal VC are set to have the logic values of 1 during an initial phase. Under this condition, the delay cell circuits 230[1]-230[m] in FIG. 2A are all turned on, such that the signal path P1 (or the control signal CKC) will have a maximum propagation delay.

In operation S402, the propagation delay of the quantization corresponding to the first bit of the digital code D1 is shortened, and the signal analysis is performed according to the signals S2P and S2N. In operation S403, whether the result of the signal analysis meets a predetermined requirement is determined. If the result of the signal analysis meets the predetermined requirement, operation S402 is performed again. If the result of the signal analysis does not meet the predetermined requirement, operation S404 is performed. In operation S404, the propagation delay of the quantization corresponding to the first bit of the digital code D1 is adjusted to a previous specific delay time, and the corresponding relation among the specific delay time and the delay cell circuits is recorded. In operation S405, the above operations S402 to S404 are repeatedly performed until the corresponding relationships among specific delay time corresponding to the quantization for all bits in the digital code D1 and the delay cell circuits are recorded.

For example, the delay control circuit 170 may analyze the digital codes generated based on the signals S2P and S2N (e.g., the digital code D2 or D1 in FIG. 1), especially analyze according to multiple digital codes, to determine whether the currently generated digital code meets the predetermined requirement. In some embodiments, the delay control circuit 170 may analyze parameter(s) including, for example but not limited to, an effective number of bits, integral nonlinearity (INL), and/or differential nonlinearity (DNL) of the digital code and determine whether one or more parameters meet the predetermined requirement. If the analysis results meet the predetermined requirement, it indicates that the delay time introduced by the delay adjustment circuit 130 is sufficient to stabilize the capacitor array circuit 110 and therefore generate a digital output that meets the expected performance. As a result, the delay time introduced by the delay adjustment circuit 130 may continue to be reduced (for example, to select different delay cell circuits, or to turn on fewer delay cell circuits), and to determine whether the analysis result meets the predetermined requirement.

Alternatively, if the analysis result does not meet the predetermined requirement, it may indicate that the delay time introduced by the delay adjustment circuit 130 is too short to stabilize the capacitor array circuit 110. In this way, the delay time introduced by the delay adjustment circuit 130 may be adjusted back to the previous specific delay time, and the corresponding relation between this specific delay time and the delay cell circuits is recorded. For example, when the delay cell circuits 230[1]-230[3] in the delay cell circuits 230[1]-230[m] are turned on, the propagation delay introduced by the delay adjustment circuit 130 is that specific delay time. In other words, when converting the first bit of the digital code D1, the bits C[1]-C[3] in the control signal VC have the logic values of 1 and the bits C[4]-C[m] in the control signal VC have the logic values of 0. By this analogy, with the same operations, it is able to obtain the corresponding relation between the specific delay time and the bits C[1]-C[m] of the control signal VC in the quantization corresponding to the bits of the digital code D1. As a result, the above corresponding relations may be recorded as a lookup table, and a set of corresponding bits C[1]-C[m] may be selected according to the bits S[1]-S[n] to selectively turn on the delay cell circuits 230[1]-230[m].

For example, as mentioned above, when converting the first bit of the digital code D1, the bits C[1]-C[3] in the control signal VC have the logic values of 1 and the bits C[4]-C[m] in the control signal VC have the logic values of 0. When all bits S[1]-S[n] have the logic values of 0, it indicates that the first bit of the digital code D1 is to be converted. In response to the bits S[1]-S[n], the delay control circuit 170 selects data associated with the bits C[1]-C[m] from the lookup table and outputs the bits C[1]-C[3] having the logic values of 1 and the remaining bits C[4]-C[m] having the logic values of 0 accordingly. Similarly, when the bit S[1] has the logic value of 1 and the bits S[2]-S[n] have the logic values of 0, it indicates that the current quantization for converting the first bit of the digital code D1 has done, and the second bit of the digital code D1 will begin to be generated. In response to those bits S[1]-S[n], the delay control circuit 170 may select data associated with the bits C[1]-C[m] from the lookup table to control the delay adjustment circuit 130 to provide the propagation delay corresponding to the second bit of the digital code D1. With this analogy, the operations of the delay control circuit 170 can be understood.

In some embodiments, operations shown in FIG. 4 may be performed offline. For example, the lookup table may be generated by a circuit simulation tool or a chip measurement tool by analyzing the digital code D2 (or the digital code D1) in advance. In some embodiments, operations shown in FIG. 4 may be performed after the device is powered on for the first time. For example, the delay control circuit 170 may perform the aforementioned operations after the device is first powered on to generate the lookup table.

Operations about the delay control circuit 170 are given for illustrative purposes, and the present disclosure is not limited thereto. Various circuits and/or control logics that are able to analyze digital code(s) or detect quantization(s) to control the delay adjustment circuit 130 are within the contemplated scope of the present disclosure.

FIG. 5 illustrates a flow chart of a signal conversion method 500 according to some embodiments of the present disclosure. In operation S510, input signals are sampled by a capacitor array circuit to generate first signals, in which the capacitor array circuit is configured to be sequentially switched according to a first digital code. In operation S520, the first signals are quantized by a quantizer circuit according to a first control signal to generate second signals, in which the quantizer circuit receives the first control signal via a signal path. In operation S530, a propagation delay of the first control signal is selectively adjusted by a delay adjustment circuit, in which the delay adjustment circuit and the signal path are coupled in parallel with each other. In operation S540, the first digital code is generated according to the second signals. In operation S550, whether a quantization of the quantizer circuit is completed is detected to generate the first control signal.

The above operations of the signal conversion method 500 can be understood with reference to above embodiments, and thus the repetitious descriptions are not further given. The above description of the signal conversion method 500 includes exemplary operations, but the operations of the signal conversion method 500 are not necessarily performed in the order described above. Operations of the signal conversion method 500 may be added, replaced, changed order, and/or eliminated, or the operations of the signal conversion method 500 may be executed simultaneously or partially simultaneously as appropriate, in accordance with the spirit and scope of various embodiments of the present disclosure.

As described above, the SAR ADC and the signal conversion method provided in some embodiments of the present disclosure may adjust the start time of the quantization according to impacts from actual variation(s), in order to reduce impacts from stabilization error. In addition, the delay adjustment circuit employed in some embodiments of the present application is coupled in parallel with the signal path (rather than coupled in series), and therefore does not significantly reduce the maximum operating speed of the SAR ADC (compared with traditional approaches).

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A successive approximation register analog to digital converter, comprising:

a capacitor array circuit configured to sample a plurality of input signals to generate a plurality of first signals, wherein the capacitor array circuit is sequentially switched according to a first digital code;

a quantizer circuit configured to quantize the plurality of first signals according to a first control signal to generate a plurality of second signals, wherein the quantizer circuit receives the first control signal via a signal path;

a delay adjustment circuit coupled in parallel with the signal path and configured to selectively adjust a propagation delay of the first control signal;

a control logic circuit configured to generate the first digital code according to the plurality of second signals;

a detector circuitry configured to detect whether a quantization of the quantizer circuit is completed to generate the first control signal; and a delay control circuit configured to generate a second control signal according to the plurality of second signals and a plurality of bits, wherein the detector circuitry is configured to perform a counting operation according to the plurality of second signals to sequentially generate the plurality of bits, and the delay adjustment circuit is further configured to set the propagation delay according to the second control signal.

2. The successive approximation register analog to digital converter of claim 1, wherein the delay adjustment circuit comprises:

a plurality of delay cell circuits configured to adjust a capacitance value of the signal path according to a second control signal, in order to set the propagation delay.

3. The successive approximation register analog to digital converter of claim 2, wherein one of the plurality of delay cell circuits comprises:

a first transistor, wherein a first terminal of the first transistor receives a corresponding bit of the second control signal, and the first terminal of the first transistor is coupled to a second terminal of the first transistor;

an inverter circuit, wherein an input terminal of the inverter circuit is coupled to the second terminal of the first transistor; and a second transistor, wherein a first terminal and a second terminal of the second transistor are coupled to an output terminal of the inverter circuit, and a control terminal of the first transistor and a control terminal of the second transistor are coupled to the signal path.

4. The successive approximation register analog to digital converter of claim 3, wherein a conductivity type of the first transistor is opposite to a conductivity type of the second transistor.

5. The successive approximation register analog to digital converter of claim 4, wherein the first transistor is a P-type transistor, and the second transistor is an N-type transistor.

6. The successive approximation register analog to digital converter of claim 2, wherein one of the plurality of delay cell circuits comprises:

a switch configured to be selectively turned on according to a corresponding bit of the second control signal; and a capacitive element coupled to the signal path via the switch.

7. The successive approximation register analog to digital converter of claim 1, wherein the quantizer circuit is further configured to selectively reset the plurality of second signals according to the first control signal.

8. The successive approximation register analog to digital converter of claim 1, wherein the detector circuitry is configured to perform a counting operation according to the plurality of second signals to sequentially generate a plurality of bits, and generate the first control signal according to a last bit in the plurality of bits.

9. The successive approximation register analog to digital converter of claim 1, wherein the detector circuitry comprises:

a first logic gate circuit configured to generate a valid signal according to the plurality of second signals;

a counter circuit configured to sequentially generate a plurality of bits according to the valid signal and a clock signal; and a second logic gate circuit configured to generate the first control signal according to the valid signal, the clock signal, and a last bit in the plurality of bits.

10. A successive approximation register analog to digital converter, comprising:

a capacitor array circuit configured to sample a plurality of input signals to generate a plurality of first signals, wherein the capacitor array circuit is sequentially switched according to a first digital code;

a quantizer circuit configured to quantize the plurality of first signals according to a first control signal to generate a plurality of second signals, wherein the quantizer circuit receives the first control signal via a signal path;

a delay adjustment circuit coupled in parallel with the signal path and configured to selectively adjust a propagation delay of the first control signal;

a control logic circuit configured to generate the first digital code according to the plurality of second signals; and a detector circuitry configured to detect whether a quantization of the quantizer circuit is completed to generate the first control signal, wherein the propagation delay is configured to adjust a start time of the quantization.

11. A signal conversion method, comprising:

sampling, by a capacitor array circuit, a plurality of input signals to generate a plurality of first signals, wherein the capacitor array circuit is sequentially switched according to a first digital code;

quantizing, by a quantizer circuit, the plurality of first signals according to a first control signal to generate a plurality of second signals, wherein the quantizer circuit receives the first control signal via a signal path;

selectively adjusting, by a delay adjustment circuit, a propagation delay of the first control signal, wherein the delay adjustment circuit and the signal path are coupled in parallel with each other;

generating the first digital code according to the plurality of second signals;

detecting whether a quantization of the quantizer circuit is completed to generate the first control signal; and generating a second control signal according to the plurality of second signals and a plurality of bits, wherein the plurality of bits are generated by performing a counting operation according to the plurality of second signals, and the delay adjustment circuit is further configured to set the propagation delay according to the second control signal.

12. The signal conversion method of claim 11, wherein the propagation delay is configured to adjust a start time of the quantization.

13. The signal conversion method of claim 11, wherein the delay adjustment circuit comprises a plurality of delay cell circuits, and the plurality of delay cell circuits are configured to adjust a capacitance value of the signal path according to a second control signal, in order to set the propagation delay.

14. The signal conversion method of claim 13, wherein one of the plurality of delay cell circuits comprises:

a first transistor, wherein a first terminal of the first transistor receives a corresponding bit of the second control signal, and the first terminal of the first transistor is coupled to a second terminal of the first transistor;

an inverter circuit, wherein an input terminal of the inverter circuit is coupled to the second terminal of the first transistor; and a second transistor, wherein a first terminal and a second terminal of the second transistor are coupled to an output terminal of the inverter circuit, and a control terminal of the first transistor and a control terminal of the second transistor are coupled to the signal path.

15. The signal conversion method of claim 14, wherein a conductivity type of the first transistor is opposite to a conductivity type of the second transistor.

16. The signal conversion method of claim 13, wherein one of the plurality of delay cell circuits comprises:

a switch configured to be selectively turned on according to a corresponding bit of the second control signal; and a capacitive element coupled to the signal path via the switch.

17. The signal conversion method of claim 11, wherein the quantizer circuit is further configured to selectively reset the plurality of second signals according to the first control signal.

18. The signal conversion method of claim 11, wherein detecting whether the quantization of the quantizer circuit is completed to generate the first control signal comprises:

performing a counting operation according to the plurality of second signals to sequentially generate a plurality of bits; and generating the first control signal according to a last bit in the plurality of bits.

* * * * *